United States Patent [19]

Lu et al.

[11] Patent Number: 5,429,977

[45] Date of Patent: Jul. 4, 1995

[54] METHOD FOR FORMING A VERTICAL TRANSISTOR WITH A STACKED CAPACITOR DRAM CELL

[75] Inventors: Chin-Yuan Lu, Hsinchu; Horng-Huei Tseng, Hsin, both of Taiwan

[73] Assignee: Industrial Technology Research Institute, Hsinchu, Taiwan

[21] Appl. No.: 208,713

[22] Filed: Mar. 11, 1994

[51] Int. Cl.[6] ...................... H01L 21/70; H01L 27/00
[52] U.S. Cl. ......................................... 437/52; 437/60; 437/919
[58] Field of Search ...................... 437/47, 52, 60, 919; 257/301–303, 306, 309

[56] References Cited

U.S. PATENT DOCUMENTS

4,845,539  7/1989  Inoue ..................................... 257/302
4,891,327  1/1990  Okumura .............................. 437/52

OTHER PUBLICATIONS

"Advanced Cell Structure for Dynamic RAMs" by Nicky C. C. Lu, Pub in IEEE Circuits and Device Magazine, Jan. 1989 pp. 27–36.
W. F. Richardson et al., "A Trend Transistor Cross-Pointe DRAM Cell", Pub. in 1985 DRAM 85 pp. 714–717.

*Primary Examiner*—Olik Chaudhuri
*Assistant Examiner*—H. Jey Tsai
*Attorney, Agent, or Firm*—George O. Saile

[57] ABSTRACT

There is shown a method for fabricating a vertical DRAM cell which includes a field effect transistor having a gate electrode and source/drain elements and a capacitor. There is provided a pattern of field oxide isolation in a silicon substrate wherein there are a pattern of openings to the silicon substrate. A pattern is formed of bit lines and a pattern of lines of holes with a hole located within each of the openings to said silicon substrate which lines of holes and bit lines are perpendicular to one another and which the lines cross at the planned locations of the vertical DRAM cell at the pattern of openings to the silicon substrate. A gate dielectric is formed on the surfaces of the holes. A doped polysilicon layer is formed in and over the holes so that it covers the gate dielectric and the field oxide isolation. A silicon nitride layer is formed over the doped polysilicon layer. Patterning and etching is done to the silicon nitride layer and doped polysilicon layer to form the opening for the capacitor node contact to the buried source/drain of the vertical field effect transistor (switching device for the storage signal) and establish said gate electrode in the hole and word line pattern over the field oxide insulator. A silicon oxide spacer is formed over the sidewalls of the silicon nitride and doped polysilicon layer. A capacitor is formed in and over the hole to complete the vertical DRAM cell.

14 Claims, 4 Drawing Sheets

METHOD FOR FORMING A VERTICAL TRANSISTOR WITH A STACKED CAPACITOR DRAM CELL

RELATED APPLICATION

U.S. Pat. No. 5,362,665 entitled "A Vertical DRAM Cross Point Memory Cell and Fabrication Method" by C. Y. Lu.

BACKGROUND OF THE INVENTION

1. Field of the Invention

This invention relates to a method for making a vertical transistor with high density DRAM cell and the resulting structure, and particularly to those methods which produce a vertical field effect transistor and capacitor structure.

2. Description of the Prior Art

As DRAMs are scaled down in dimensions, there is a continuous challenge to maintain a sufficiently high stored charge per capacitor unit area. In order to construct high density DRAMs in a reasonable sized chip area, the cell structures have to change from the conventional planar-type capacitors to either trench capacitors or stack capacitors, in particular beyond the 4 Mbit DRAM era. All efforts to increase capacitance without increasing the planar area of the capacitor can be categorized into building three dimensional capacitor structures to increase the capacitor area without increasing the planar area of the capacitor. There are two major branches of this approach, that is trench capacitors and stacked capacitors. In the category of trench capacitors, when the DRAM is beyond 16 Mbit, the trench needs to be very deep. There are technology and even theoretical physical limitations to processing the deep trenches that would be needed. When the stacked capacitor approach is used to fabricate 16 Mbit DRAMs and beyond, very complicated stacked structures are needed, such as fin structures, crown structures, and so forth.

The one transistor DRAM cell includes a field effect transistor and the capacitor in a three dimensioned structure as envisioned for future cells beyond the 16 Mbit device level. In "Advanced Cell Structures for Dynamic RAMS" by Nicky C. C. Lu, Published in IEEE Circuits and Device Magazine January 1989, pp. 27–36, Dr. Lu gives many types of three dimensional DRAM cell designs which have been known to the art. Particularly, on page 34, FIG. 15 there is shown various three dimensional cells. It is interesting to note that none of these DRAM cells are truly vertical, that is with the capacitor directly above the field effect device or alternatively the field effect device directly above the capacitor. W. F. Richardson et al in "A TRENCH TRANSISTOR CROSS-POINT DRAM CELL" Published in 1985 IEDM 85 pages 714–717 describes a vertical DRAM cell with the field effect device directly above the capacitor which is located within a trench. There is no known reference to a vertical DRAM memory cell with a capacitor located directly above a MOSFET device as schematically shown in FIG. 9.

SUMMARY OF THE INVENTION

It is an object of the invention to provide a method for fabricating a one transistor and one capacitor DRAM cell which is truly three dimensional and vertical in the sense that the capacitor and field effect transistor is directly above one another.

It is a further object of the invention to provide a method for fabricating a three dimensional, truly vertical, one transistor DRAM cell which is useful for 16 Mbit device level and beyond.

It is a still further object of the invention to provide a one transistor DRAM cell which is truly three dimensional and vertical in the sense that the capacitor and vertical channel field effect transistor is directly above one another.

The referred to related Patent Application describes the basis invention of DRAM cell device structures which are truly vertical, three dimensional one field effect transistor and one capacitor DRAM cell. This cell has the capacitor physically and electrically directly above the vertical field effect transistor.

Further in accordance with the invention there is shown a method for fabricating a vertical DRAM cell which includes a field effect transistor having a gate electrode and source/drain elements and a capacitor. There is provided a pattern of field oxide isolation in a silicon substrate wherein there are a pattern of openings to the silicon substrate. A pattern is formed of bit lines and a pattern of lines of holes with a hole located within each of the openings to said silicon substrate which lines of holes and bit lines are perpendicular to one another and which the lines cross at the planned locations of the vertical DRAM cell at the pattern of openings to the silicon substrate. A gate dielectric is formed on the surfaces of the holes. A doped polysilicon layer is formed in and over the holes so that it covers the gate dielectric and the field oxide isolation. A silicon nitride layer is formed over the doped polysilicon layer. Patterning and etching is done to the silicon nitride layer and doped polysilicon layer to form the opening for the capacitor node contact to the buried source/drain of the vertical field effect transistor (switching device for storage signal) and establish said gate electrode in the hole and word line pattern over the field oxide insulator. A silicon oxide spacer is formed over the sidewalls of the silicon nitride and doped polysilicon layer. A capacitor node polysilicon electrode in the hole and in node contact to the buried source/drain of the vertical field effect transistor (switching device for storage signal). A capacitor dielectric is formed over the capacitor node polysilicon electrode. A capacitor polysilicon plate electrode is formed over the capacitor dielectric to complete the vertical DRAM cell.

The preferred device structure includes a vertical DRAM cell which includes a field effect transistor having a gate electrode and source/drain elements and a capacitor. A base substrate is provided. A pattern of field oxide isolation is located in the silicon substrate wherein there is a pattern of openings to the silicon substrate. A pattern of lines of holes with a hole located within each of the openings to the silicon substrate which lines of holes and the bit lines are perpendicular to one another and which the lines cross at the planned locations of the vertical DRAM cell at the pattern of openings to the silicon substrate. A gate dielectric is formed on the surfaces of the holes. A doped polysilicon layer in and over the holes so that it covers the gate dielectric and the field oxide isolation. A silicon nitride layer over the doped polysilicon layer. The silicon nitride layer and doped polysilicon layer having an opening for the capacitor node contact to the buried source/drain of the vertical field effect transistor and to establish the gate electrode in the hole and word line pattern over the field oxide insulator. A silicon oxide spacer is located over the sidewalls of the silicon nitride and the doped polysilicon layer. A capacitor node polysilicon electrode in the hole and in node contact to the buried source/drain of the vertical field effect transistor. A capacitor dielectric over the capacitor node polysilicon electrode. A capacitor polysilicon plate electrode over the capacitor dielectric to complete the vertical DRAM cell.

BRIEF DESCRIPTION OF THE DRAWINGS

FIG. 9 shows the actual and final cross-section along A-A' of FIG. 1.

DESCRIPTION OF THE PREFERRED EMBODIMENTS

Figure 1:
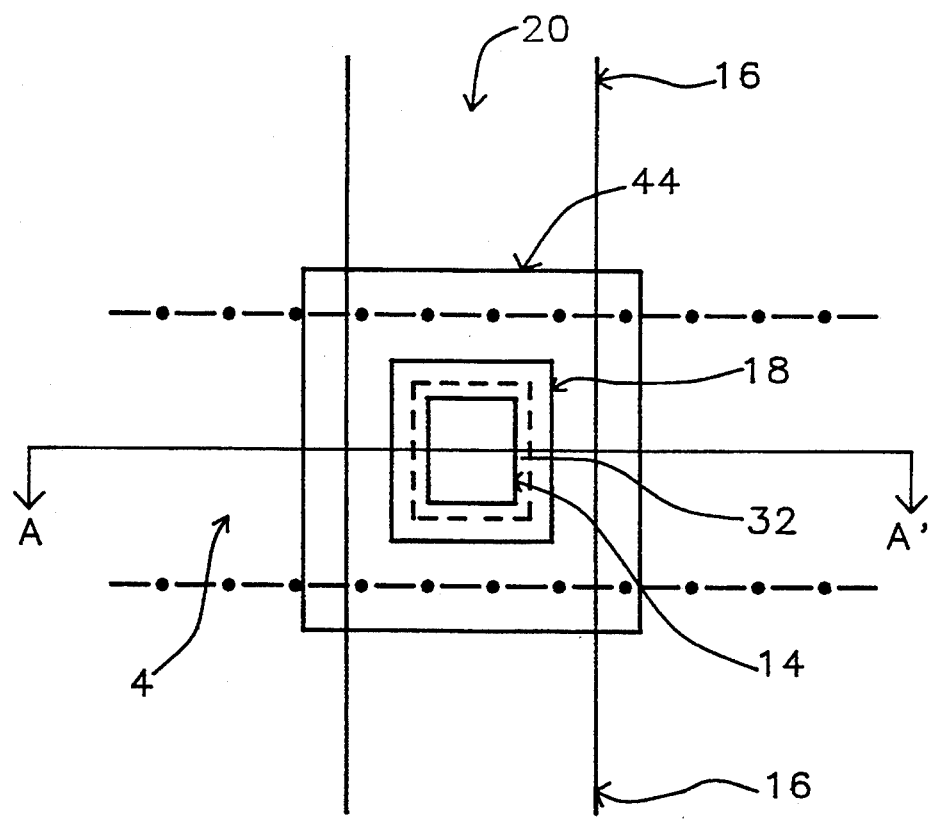
FIG. 1 is a plan view showing a portion of the memory cell array of the DRAM of one embodiment of the present invention.
Figure 2:
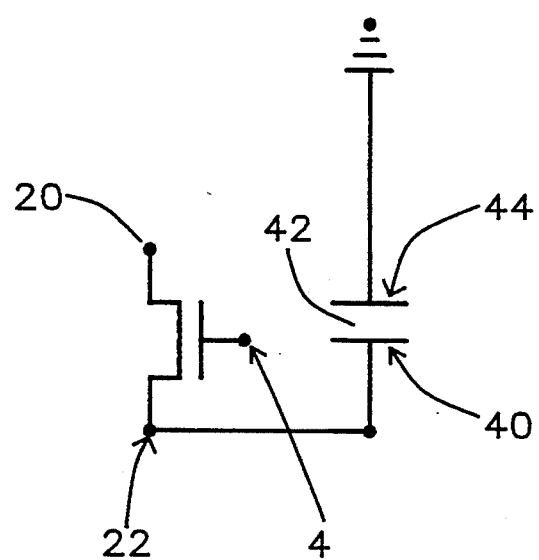
FIG. 2 is an equivalent circuit diagram of the DRAM memory cell array shown in FIG. 1.
Figure 9:
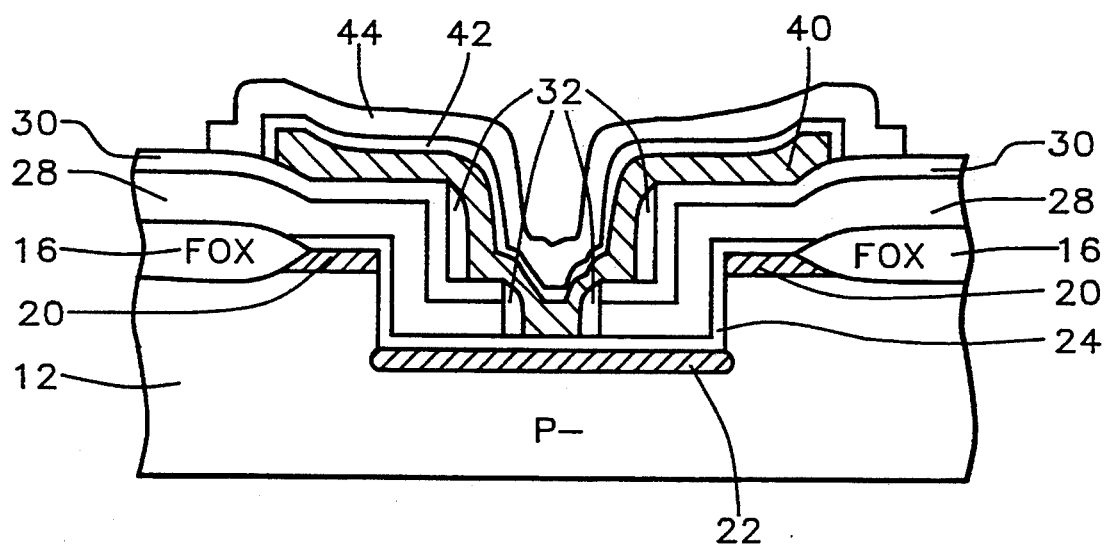

Referring now to FIGS. 1, 2 and 9, there is illustrated one embodiment of the vertical DRAM structure of the present invention. The cross-section taken along A-A' of FIG. 1 is shown in FIG. 9.

The preferred device structure includes a vertical DRAM cell which includes a vertical field effect transistor 1 having a gate electrode 2 and source/drain elements 20, 22 and a capacitor 3. A base substrate 12 is provided. A pattern of field oxide isolation 16 is located in the silicon substrate wherein there is a pattern of openings 18 in the silicon substrate.

A pattern of lines of holes 14 with a hole located within each of the openings as bounded by the silicon oxide spacer 32 edge to the silicon substrate's source/drain region 22 which lines of holes and the bit lines 20 are perpendicular to one another and which the lines 20 cross at the planned locations of the vertical DRAM cell at the pattern of openings 18 to the silicon substrate 12. A gate dielectric 24 is formed on the surfaces of the holes. A patterned, doped polysilicon layer in and over the holes so that it covers the gate dielectric and the field oxide isolation and is the word line 4 of the vertical transistor 1. A silicon nitride layer 30 is located over the doped polysilicon gate electrode 2 and word line 4 layer. The silicon nitride layer 30 and doped polysilicon layer having an opening bordered by the spacer silicon oxide layer 32 for the capacitor node contact to the buried source/drain 22 of the vertical field effect transistor 1 and to establish the gate electrode 2 in the hole and word line pattern 4 over the field oxide insulator 16. A silicon oxide spacer 32 is located over the sidewalls of the silicon nitride 30 and the doped polysilicon layer 2.

A capacitor node polysilicon electrode 40 in the hole and in node contact to the buried source/drain 22 of the vertical field effect transistor 3. A capacitor dielectric 42 over the capacitor node polysilicon electrode 40. A capacitor polysilicon plate electrode 44 over the capacitor dielectric 42 to complete the capacitor 3 of vertical DRAM cell.

The first method embodiment for making the vertical transistor DRAM cell starts with a substrate 12 of, for example P- monocrystalline silicon. The FIGS. 1, 3 through 9 can be used to fully understand the method of the invention.

The first series of steps involve the formation of the dielectric isolation regions for isolating semiconductor surface regions from other such regions in the silicon substrate layer 12. In an effort to simplify the description and the drawings the dielectric isolation between devices has been only partially shown and will not be described in detail, because they are conventional. For example, one method is uses shallow trench isolation (STI) such as that shown by B. Davari et al in IEDM-88 page 92 or P. C. Fazan et al in IEDM-93 page 57. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 16. Then semiconductor devices can be provided in the pattern of openings 18 to the silicon substrate 12. The mask is then removed. The size of the openings 18 is critical for the vertical, one transistor DRAM cell of the present invention and are between about 8000 to 12000 Angstroms.

Figure 3:
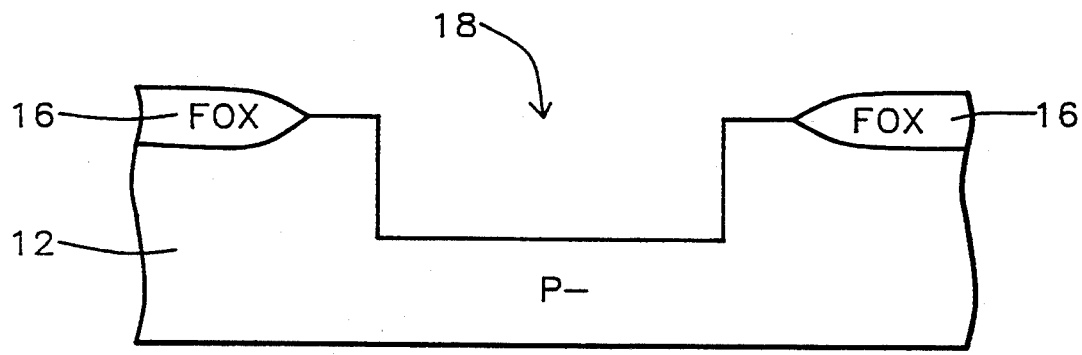
FIGS. 3 through 9 are schematic cross-sectional views taken along the line A-A' of FIG. 1 successively showing steps of manufacturing the DRAM memory cell of the present invention.

The next steps involve the formation of the line of holes 14 which are preferably centrally located within the active area of silicon substrate 18 as seen in FIG. 3. The hole pattern is formed in a mask using conventional lithography and etching techniques. The exposed silicon substrate 12 is anisotropically etched using with the conditions of etching in the Rainbow 4428 Apparatus (Lam Research Co.) at a pressure of 525 mTorr, power of 450 watts, etching rate of 4000 Angstroms/minute and gas flow conditions HBr at 80 sccm, He 216 sccm and Chlorine 420 sccm. The etching is taken to a critical depth of between about 4000 to 10000 Angstroms. The hole diameter is between about 2000 to 4000 Angstroms.

Figure 4:
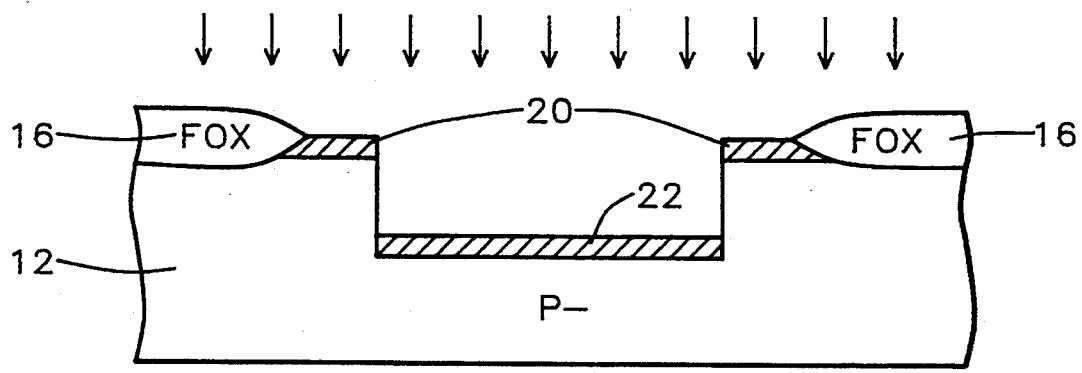

The source/drain structure of the vertical, one MOS FET DRAM cell may now be formed by the following steps. The FIG. 4 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate with appropriate substrate tub (or well) doping.

FIG. 4 shows the ion implantation of N+ dopants to form bit line/source/drain regions 20 in the surface of the silicon substrate opening 18 surrounding the hole and the source/drain regions 22 at the bottom of the hole using the field oxide 16 as the mask. The N+ source/drain ion implantation uses Arsenic, As75 with a dose of between about 2 E 15 to 1 E 16 atoms/cm.$^2$ and energy of between about 20 to 70 Kev. to complete the source/drain regions 20, 22 of the N channel MOS FET integrated circuits device as seen in the FIG. 4. This step establishes the field effect transistor with one source/drain element 20 surrounding the gate electrode at the surface, the other source/drain element 22 is at the bottom of the hole 14, and the channel is between these two source/drain elements surrounding the hole. It can be seen that this MOS FET structure in the vertical dimension allows greater channel width, which in turn overcomes the many problems of the prior art short channel devices.

Figure 5:
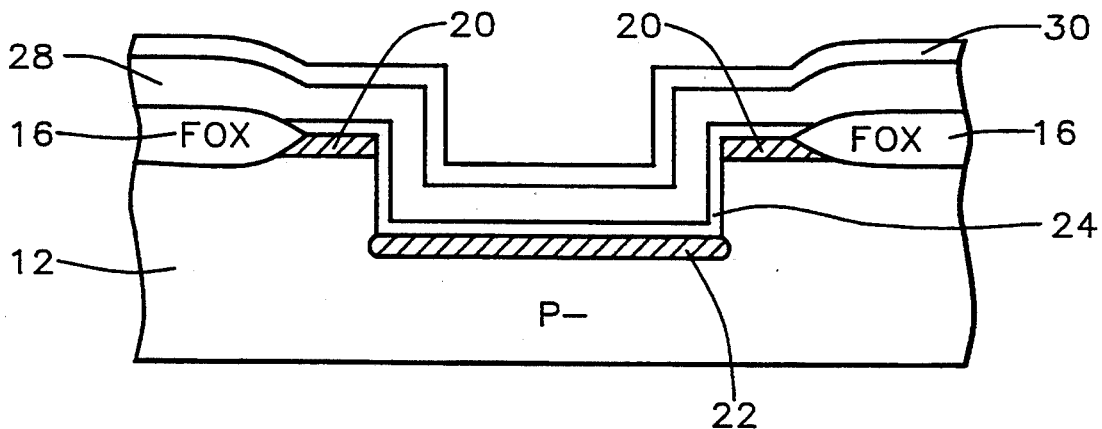
Figure 6:
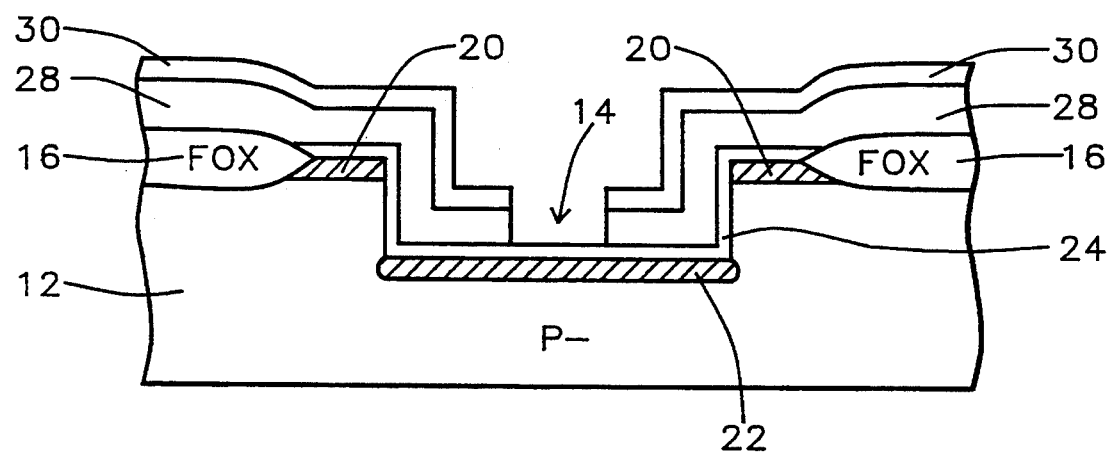

The exposed surfaces of the silicon substrate 12 is thermally oxidized to form the desired gate oxide 24 thickness. The preferred thickness is between about 80 to 200 Angstroms. Referring now to FIG. 5, the polysilicon layer 28 is blanket deposited by LPCVD (Low Pressure Chemical Vapor Deposition) method. The preferred thickness of the polysilicon layer 28 is between about 1500 to 3000 Angstroms. The polysilicon layer 28 is ion implanted with phosphorous or arsenic ions under the conditions 5 to 10 E 15 dosage atoms per $cm^2$ and 20 to 60 Kev. or doped with phosphorus oxychloride at a temperature about 900° C. Alternatively, the polysilicon layer may be doped in situ. An insulating or dielectric layer 30, such as silicon nitride is formed over the polysilicon layer 28 by the LPCVD method. Standard lithography and etching techniques are used to form the desired gate electrode and the word line pattern 28. The layers 30 and 28 are anisotropically etched to provide a desired pattern of gate electrodes and word line pattern 28 on the FOX 16 surfaces and silicon substrate surfaces as seen in FIG. 6.

Figure 7:
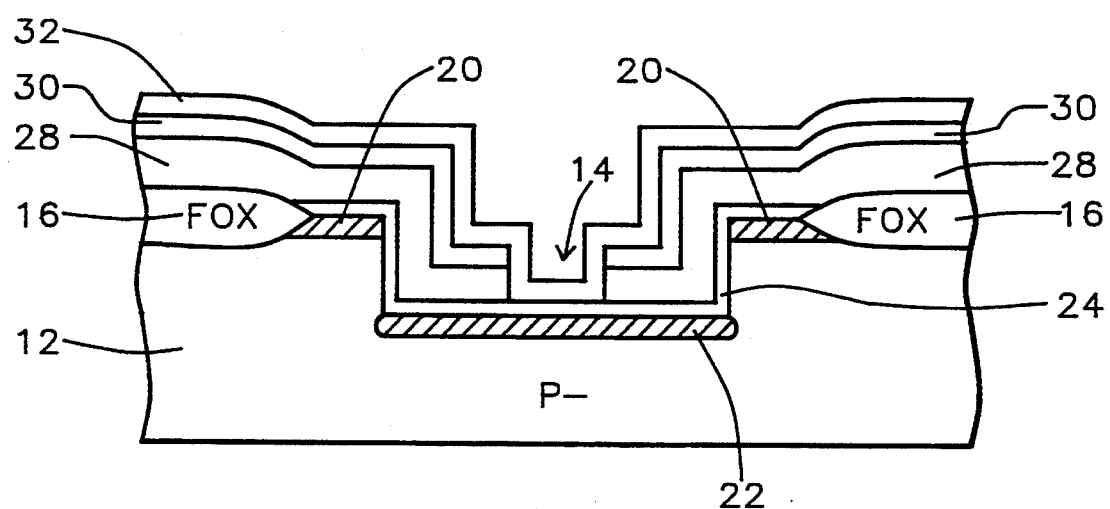
Figure 8:
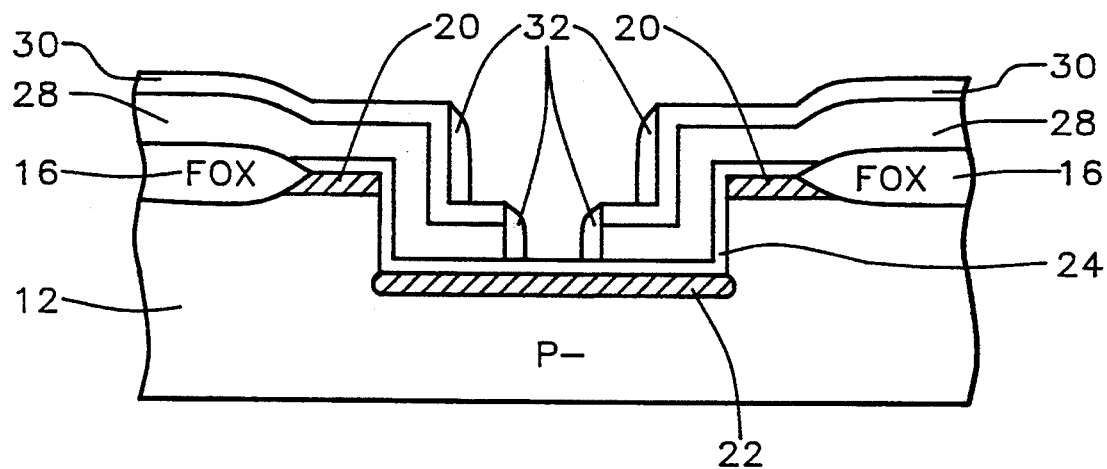

Referring to FIGS. 7 and 8, the dielectric spacer 32 is now to be formed. A low temperature silicon oxide 32 deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 32 is between about 300 to 900 Angstroms and preferably about 400 to 500 Angstroms.

An anisotropic etching of this layer produces the dielectric spacer layer 32 on the sidewalls of the layer structures 28, 30 as seen in FIG. 8. The preferred anisotropic etching uses a conventional reactive ion etching ambient. This etching step removes the silicon oxide layer 24 over the source/drain line 22.

The next series of steps form the capacitor over the MOS FET device of the one transistor, vertical DRAM cell as can be seen with reference to FIG. 9. A second doped polysilicon layer 40 is deposited to make the node contact to source/drain 22 and to form the node electrode of the capacitor. The layer 40 is patterned and etched by conventional lithography to form the node electrode of the capacitor. The capacitor dielectric 42 deposited over the node electrode 40. This dielectric may be composed of silicon nitride, silicon oxynitride, silicon oxide or combinations thereof, such as ONO which is silicon oxide, silicon nitride and silicon oxide. A capacitor plate layer 44 composed of a third doped layer of polysilicon is now deposited over the capacitor layer 42. The plate layer 44 is patterned and etched. The preferred thicknesses of these layer are node electrode 40 between about 1000 to 3000 Angstroms, capacitor dielectric 42 between about 80 to 160 Angstroms and plate electrode 44 between about 1000 to 3000 Angstroms.

While the invention has been particularly shown and described with reference to the preferred embodiments thereof, it will be understood by those skilled in the art that various changes in form and details may be made without departing from the spirit and scope of the invention.

What is claimed is:

1. The method for fabricating a vertical DRAM cell which includes a field effect transistor having a gate electrode and source/drain elements and a capacitor comprising:

providing a pattern of field oxide isolation in a silicon substrate wherein there are a pattern of openings to the silicon substrate and a pattern of bit lines and a pattern of lines of holes with a hole located within each of said openings to said silicon substrate which lines of holes and bit lines are perpendicular to one another and which said lines cross at the locations of said vertical DRAM cell at said pattern of openings to the silicon substrate;

said bit lines are source/drain elements surrounding said hole in the surface of said substrate and source/drain elements located at the bottom of said hole are formed simultaneously by ion implantation using the field oxide as the mask;

forming a gate dielectric on the surfaces of said holes;

forming a doped polysilicon layer in and over said holes so that it covers said gate dielectric and said field oxide isolation;

forming a silicon nitride layer over said doped polysilicon layer;

patterning and etching said silicon nitride layer and doped polysilicon layer to form a opening for a capacitor node contact to said bit line source/drain and establish said gate electrode in said hole and word line pattern over the said field oxide insulator;

forming a silicon oxide spacer over the sidewalls of said silicon nitride and said doped polysilicon layer to complete said vertical transistor;

forming a capacitor node polysilicon electrode in said hole and in node contact to said source/drain elements at the bottom of said hole;

forming a capacitor dielectric over said capacitor node polysilicon electrode; and forming a capacitor polysilicon plate electrode over said capacitor dielectric to complete said vertical DRAM cell.

2. The method of claim 1 wherein the dopant concentration level of said buried source/drain lines is between about 2 E 15 to 1 E 16 atoms/$cm^3$.

3. The method of claim 1 wherein the size of said pattern of openings to said silicon substrate is between about 8000 to 12000 Angstroms.

4. The method of claim 1 wherein said hole located within each of said openings to said silicon substrate is centrally located therein, the hole reaches to said buried source/drain elements, and has a diameter of between about 2000 to 4000 Angstroms.

5. The method of claim 4 wherein the depth of said hole is between about 4000 to 10000 Angstroms.

6. The method of claim 1 wherein said source/drain elements surrounding said gate electrode in the surface of said substrate and said bit lines/source/drain elements are the bottom of the said hole cooperate with said gate electrode to form said field effect transistor of said vertical channel DRAM cell.

7. The method of claim 6 wherein said capacitor is connected to said field effect transistor to form said vertical DRAM cell and the capacitor is physically directly over the field effect transistor and with its node contact to said source/drain elements at the bottom of said hole.

8. The method for fabricating a vertical DRAM cell which includes a vertical channel field effect transistor having a gate electrode and source/drain elements and a capacitor comprising:

providing a silicon substrate;

forming a pattern of field oxide isolation in said silicon substrate wherein there are a pattern of openings to the silicon substrate;

forming a pattern of lines of holes with a hole located within each of said openings to said silicon substrate which lines of holes and locations of bit lines of said vertical DRAM cell at said pattern of openings to the silicon substrate;

simultaneously forming said source/drain elements surrounding said hole in the surface of said substrate and said source/drain elements at the bottom of said hole by ion implantation using the field oxide as the mask;

wherein said source/drain elements surrounding said hole are bit lines for said cell;

forming a gate dielectric on the surfaces of said holes;

forming a doped polysilicon layer in and over said holes so that it covers said gate dielectric and said field oxide isolation;

forming a silicon nitride layer over said doped polysilicon layer;

patterning and etching said silicon nitride layer and doped polysilicon layer to form a opening for a capacitor node contact to said source/drain elements at the bottom of said hole and to establish said gate electrode in said hole and word line pattern over the said field oxide insulator;

forming a silicon oxide spacer over sidewalls of said silicon nitride and said doped polysilicon layer;

forming a capacitor node polysilicon electrode in said hole and in node contact to said source/drain elements;

forming a capacitor dielectric over said capacitor node polysilicon electrode; and forming a capacitor polysilicon plate electrode over said capacitor dielectric to complete said vertical DRAM cell.

9. The method of claim 8 wherein the dopant concentration level of said buried source/drain lines is between about 2 E 15 to 1 E 16 atoms/cm$^3$.

10. The method of claim 8 wherein the size of said pattern of openings to said silicon substrate is between about 8000 to 12000 Angstroms.

11. The method of claim 8 wherein said hole located within each of said openings to said silicon substrate is centrally located therein, the hole reaches to said buried source/drain elements, and has a diameter of between about 2000 to 4000 Angstroms.

12. The method of claim 11 wherein the depth of said hole is between about 4000 to 10000 Angstroms.

13. The method of claim 8 wherein said source/drain elements surrounding said gate electrode in the surface of said substrate and said bit lines source/drain elements are the bottom of the said hole cooperate with said gate electrode to form said field effect transistor of said vertical channel DRAM cell.

14. The method of claim 13 wherein said capacitor is connected to said field effect transistor to form said vertical DRAM cell and the capacitor is physically directly over the field effect transistor and with its node contact to said source/drain elements at the bottom of said hole.

* * * * *